United States Patent
Igura (10) Patent No.: US 7,051,183 B2
(45) Date of Patent: May 23, 2006

(54) CIRCUIT FOR RECORDING DIGITAL WAVEFORM DATA AND METHOD OF DOING THE SAME

(75) Inventor: Hiroyuki Igura, Tokyo (JP)

(73) Assignee: NEC Corporation (JP)

( * ) Notice: Subject to any disclaimer, the term of this patent is extended or adjusted under 35 U.S.C. 154(b) by 350 days.

(21) Appl. No.: 10/210,324

(22) Filed: Aug. 1, 2002

(65) Prior Publication Data
US 2003/0028748 A1 Feb. 6, 2003

(30) Foreign Application Priority Data
Aug. 1, 2001 (JP) .............................. 2001-233258

(51) Int. Cl.
*G06F 12/00* (2006.01)
*G06F 11/28* (2006.01)
(52) U.S. Cl. ........................ 711/219; 711/217; 711/218; 707/101
(58) Field of Classification Search ................ 707/101; 704/500–501, 503–504; 711/147, 156, 170
See application file for complete search history.

(56) References Cited

U.S. PATENT DOCUMENTS 5,832,490 A * 11/1998 Riley .......................... 707/101
6,215,558 B1 * 4/2001 Kubota ....................... 358/1.15
2002/0078439 A1 * 6/2002 Yamaga ......................... 725/1

FOREIGN PATENT DOCUMENTS

| JP | 63-240648 | 10/1988 |
|---|---|---|
| JP | 03-164951 | 7/1991 |
| JP | 8-255072 | 10/1996 |
| JP | 11-102310 | 4/1999 |
| JP | 11-249869 | 9/1999 |
| JP | 2001-030552 | 2/2001 |

OTHER PUBLICATIONS

*Computer Encyclopedia*; published by Asakura Shoten; Apr. 15, 1997, pp. 545, FIG.4.

* cited by examiner

Primary Examiner—Mano Padmanabhan
Assistant Examiner—Jasmine Song
(74) Attorney, Agent, or Firm—Hayes Soloway P.C.

(57) ABSTRACT

A circuit for recording digital waveform data includes (a) a first counter which counts the number of data constituting a first data sequence including a plurality of data different from one another, (b) a second counter which counts the number by which the same data is repeated to constitute a second data sequence, (c) a memory which stores all of data constituting the first data sequence and one of data constituting the second data sequence in this order together with the number counted by the first counter and the number counted by the second counter, and (d) a controller which transmits an address signal to said memory, and controls operation of the first and second counters.

12 Claims, 13 Drawing Sheets

| | TAG | | |
|---|---|---|---|
| 0 | 0 | D0 | ⎫ |
| 1 | 0 | D1 | ⎬ N |
| 2 | 0 | D2 | ⎪ |
| 3 | 0 | D3 | ⎭ |
| 4 | 0 | D4 | |
| 5 | 1 | M | |
| 6 | 0 | D5 | ⎫ |
| 7 | 0 | D6 | ⎬ L |
| 8 | 0 | D7 | ⎭ |
| 9 | 0 | D8 | |
| 10 | 1 | K | |
| 11 | 0 | D9 | |

CIRCUIT FOR RECORDING DIGITAL WAVEFORM DATA AND METHOD OF DOING THE SAME

BACKGROUND OF THE INVENTION

1. Field of the Invention

The invention relates to a circuit for recording digital waveform data and a method of recording digital waveform data, and more particularly to such a circuit and a method both of which are capable of reducing capacity of a memory in which data is to be stored.

2. Description of the Related Art

A circuit for recording digital waveform data is used for storing signal waveforms in a large-scale integrated circuit (LSI). Such a circuit is generally arranged outside the LSI, and is electrically connected to the LSI through it's signal pins.

In these days, with higher integration in LSIs, the LSI has been fabricated as a system-on-chip (SOC) having a plurality of LSIs integrated into a single LSI. In the SOC, it is quite difficult to externally output signals necessary for monitoring the operation of a target LSI.

As one of the solutions to such a problem, those skilled in the art could readily suggest that a circuit for recording digital waveform data be mounted on an LSI to be monitored. However, if a circuit for recording digital waveform data was large in size, the cost for fabricating the LSI would increase. Hence, there has been a need for a small-sized circuit for recording digital waveform data.

Figure 1:
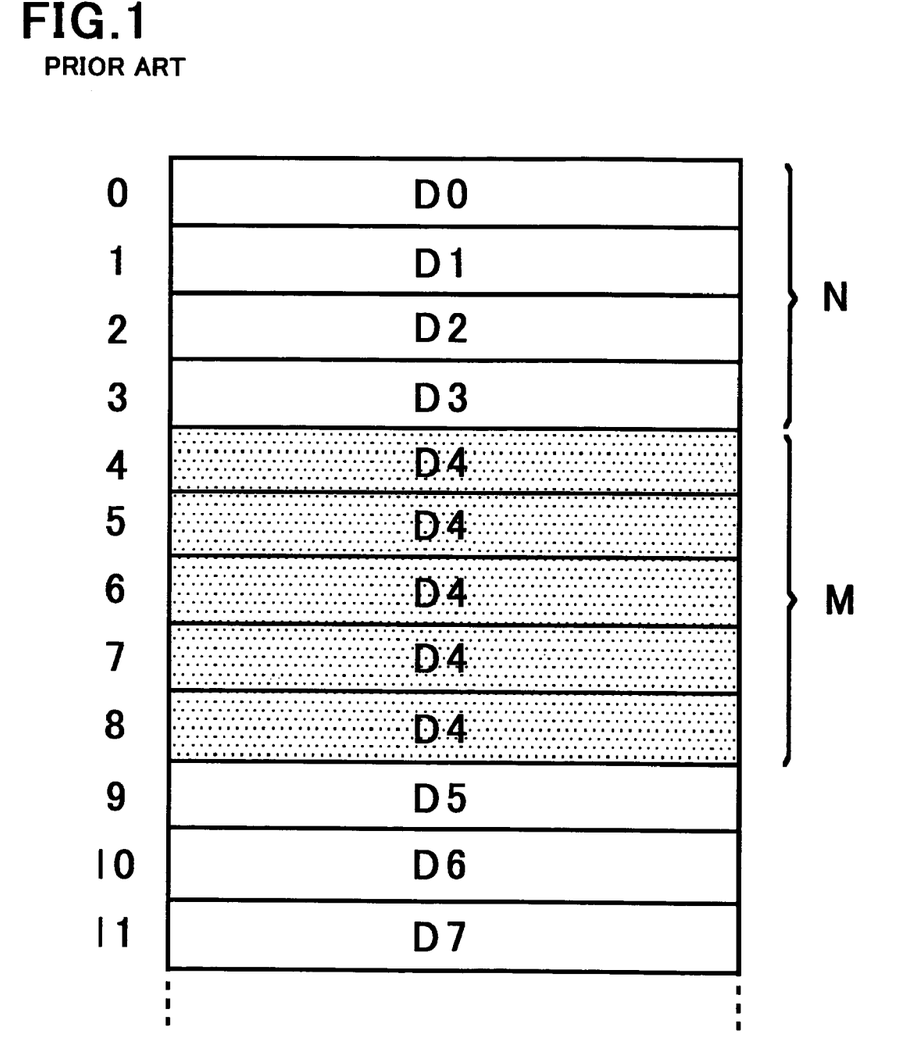
FIG. 1 illustrates what is stored in memory using a conventional method of recording digital waveform data.

FIG. 1 shows an example of operation in a conventional method of recording digital waveform data. For instance, when data, shown in FIG. 2, is stored in a circuit for recording digital waveform data, the data is stored in a memory in the order shown without any processing.

The conventional method illustrated in FIG. 1 requires a memory to have a capacity equal to the amount of input data, since input digital data is stored in the memory as it is. When a circuit for recording digital waveform data was arranged independently of and outside the LSI, the conventional method was frequently selected, because several memories could be used.

Figure 3:
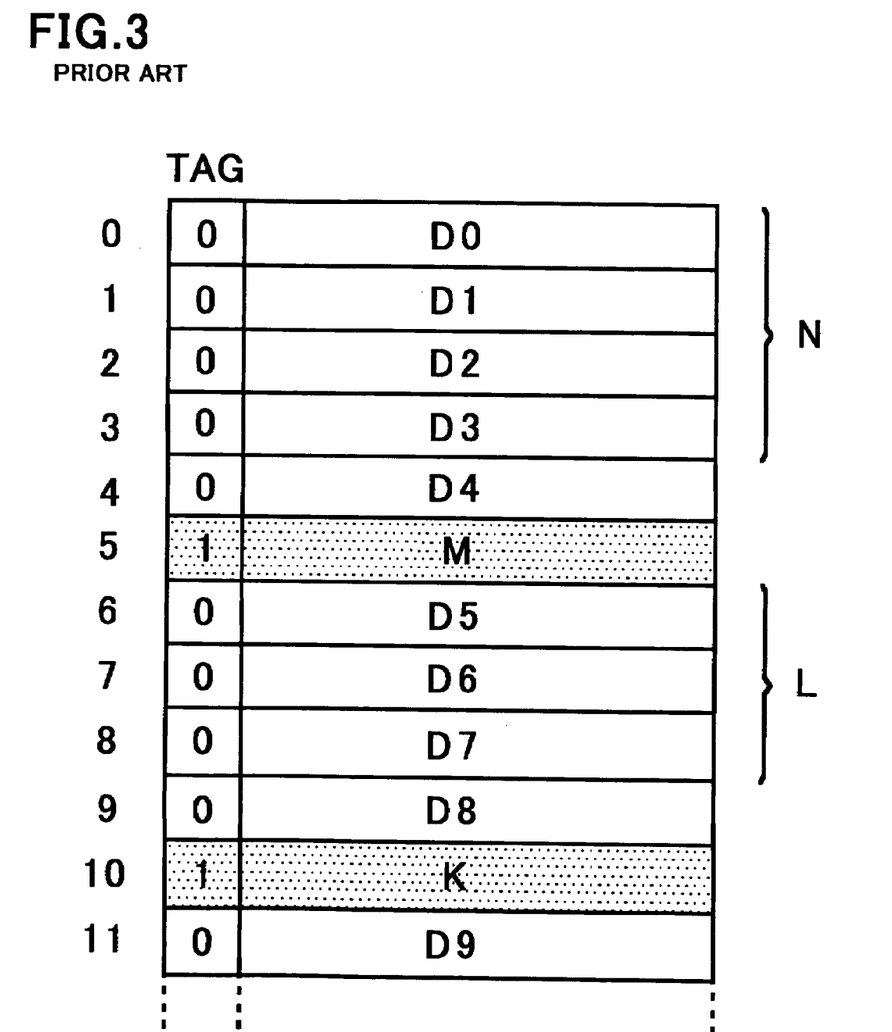
FIG. 3 illustrates what is stored in memory using another conventional method of recording digital waveform data.

FIG. 3 shows another example of a conventional method of recording digital waveform data. In the illustrated method, when the same data is repeatedly input into a circuit, the amount of data stored in memory is reduced by storing the number of times the data repeats.

Figure 2:
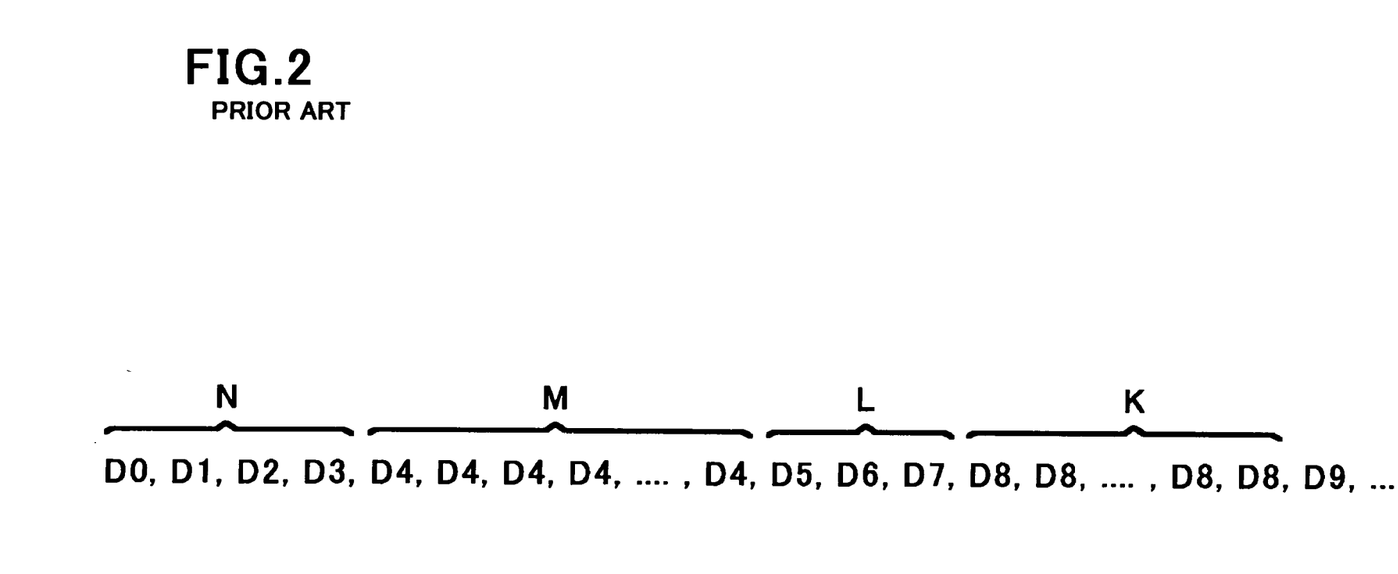
FIG. 2 shows an example of data to be input into a memory.

FIG. 3 shows a memory that stores the data illustrated in FIG. 2. The memory is designed to have a 1-bit storage area for each address. Such a 1-bit storage area is called a TAG bit. When the TAG bit is 0, data stored in an address associated with the TAG bit is new input data. In contrast, when the TAG bit is 1, data stored in an address associated with the TAG bit is the number of times the data stored in the previous address is repeated.

With reference to FIG. 3, since the data from D0 to D3 is associated with a TAG bit that is equal to 0, data from D0 to D3 are stored in a memory as they are. Data M is associated with a TAG bit that is equal to 1. Accordingly, data M indicates that the data stored in the previous address M times. (see FIG. 2).

In accordance with above-mentioned method, it would be possible to reduce the size of a memory that stores input data.

As a method of compressing data, "Computer. Encyclopedia" published by Asakura Shoten, Apr. 15, 1987, pp. 545, FIG. 4, suggests that if certain data is not used as ordinary data, the certain data is used for indicating the number of times the same data is repeated.

However, in order to use the above-mentioned method, data input into memory has to be fixed to a certain degree. Accordingly, the above-mentioned method is not applicable to a circuit for recording digital waveform data. In order to allow any data to be input into memory, the memory would have to include the TAG bits illustrated in FIG. 3.

The conventional method, illustrated in FIG. 3, that uses a TAG bit requires a smaller memory capacity than the conventional method illustrated in FIG. 1 where input data is stored as is. However, the conventional method illustrated in FIG. 3 requires a memory for storing TAG bits as well as a memory for storing digital waveform data, resulting in additional memory capacity for storing TAG bits.

Japanese Unexamined Patent Publication No. 8-255072 (A) has suggested an apparatus for transferring data that includes a data compressor. The data compressor compresses the data file, and the compressed data file is transmitted. The data compressor compresses a plurality of data blocks having the same content that are successively arranged in the data file, into a single data block having a block address of the first data block.

Japanese Unexamined Patent Publication No. 11-102310 (A) has suggested a program tracer that records address data of a program being executed. When a command sequence of the program carries out a loop process, the program tracer counts and records the number of loops in the loop process, and records only the address data regarding the command sequence of the final loop.

Japanese Unexamined Patent Publication No. 11-249869 (A) has suggested a computing apparatus that includes: a flexible operation network comprised of a plurality of computing units, a data-compressing circuit that compresses data to be computed when the same outputs are successively repeatedly transmitted from the operation network, a memory that stores both the data to be computed and the number of times the same outputs are repeated, and a data-expanding circuit for expanding the compressed data to data in an original form when the data is to be transmitted from the memory.

Japanese Unexamined Patent Publication No. 2001-30552 (A) has suggested a method of compressing received data in accordance with a pack-pit process, and transferring the thus compressed data, including the steps of: storing received data into a buffer, reading data out of the buffer and making a tag, overriding the tag in an area other than the area that different data is successively arranged, reading the tag out of the buffer, and transferring data stored in the buffer in accordance with a pack-pit process dependent on the tag.

However, the above-mentioned problem remains unsolved even in these Publications.

SUMMARY OF THE INVENTION

In view of the above-mentioned problem with the conventional methods, it is an object of the present invention to provide a circuit for recording digital waveform data in a memory without increasing memory capacity. It is also an object of the present invention to provide a method of doing the same.

In one aspect of the present invention, a circuit is provided for recording digital waveform data wherein, assuming that a first data sequence includes a plurality of data different from one another and a second data sequence includes a plurality of the same data, data including all of data constituting the first data sequence and one of data constituting the second data sequence in this order are recorded in the circuit together with additional data including the number of data constituting the first data sequence and the number by which the same data is repeated in the second data sequence.

It is preferable that the additional data is written into a common address. For instance, the additional data may be written into an address located immediately before the first data sequence, or into an address located immediately subsequent to the second data sequence.

Figure 4:
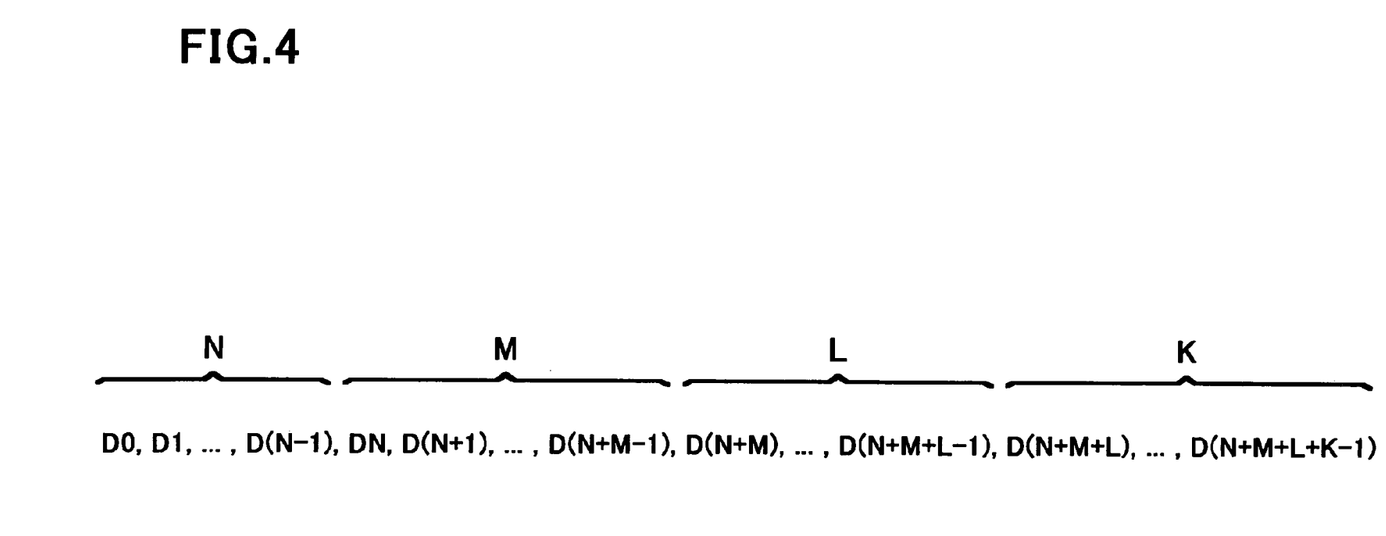
FIG. 4 shows an example of data to be input into a memory in a circuit for recording digital waveform data in accordance with the present invention.

With reference to FIG. 4, it is assumed that data including the following data sequences is input into a memory:
 (a) a first data sequence including N data D0 to D(N−1) wherein data D0 to D(N−1) are different from one another;
 (b) a second data sequence including M data DN to D(N+M−1) wherein data DN to D(N+M−1) are equal to one another;
 (c) a third data sequence including L data D(N+M) to D(N+M+L−1) wherein data DM to D(M+L−1) are different from one another; and
 (d) a fourth data sequence including K data D(N+M+L) to D(N+M+L+K−1) wherein data D(N+M+L) to D(N+M+L+K−1) are equal to one another.

Figure 5:
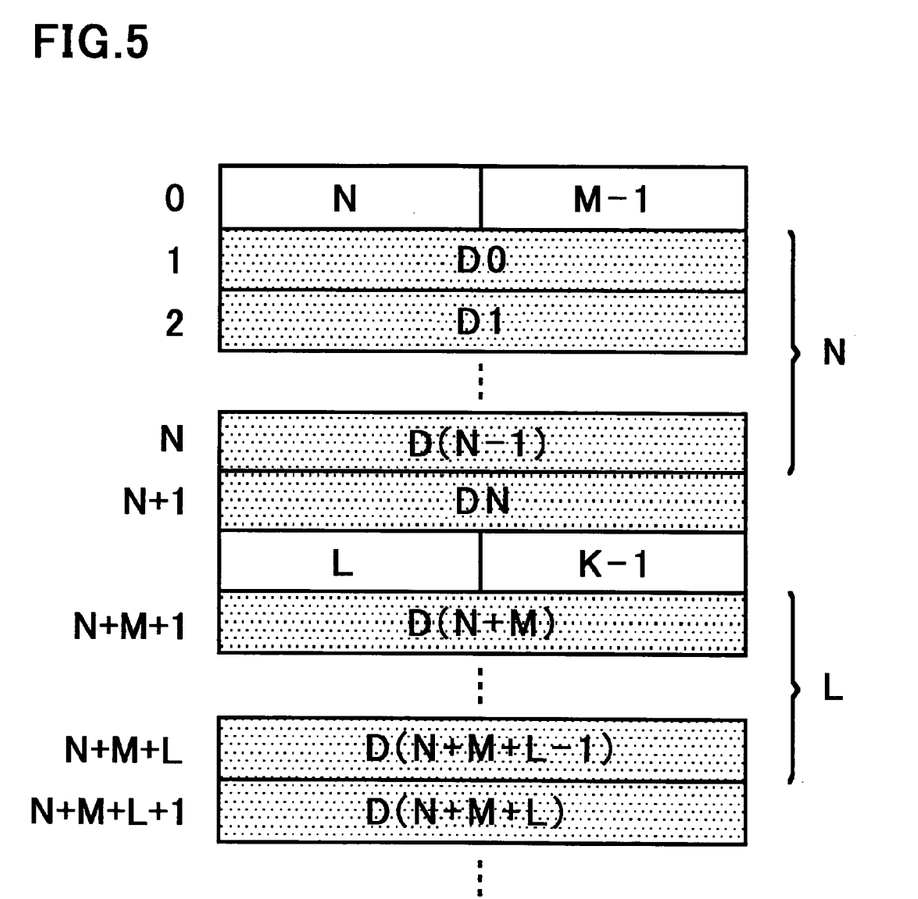
FIG. 5 shows data stored in memory in a circuit for recording digital waveform data in accordance with the present invention.

FIG. 5 shows arrangement of the first to fourth data sequences in memory.

As illustrated in FIG. 5, the first and second data sequences are treated as a first group. At the head of the first group is arranged additional data including N i.e., the number of data constituting the first data sequence, and (M−1) where M is the number of times the same data is repeated in the second data sequence. Following the additional data are arranged data constituting the first data sequence and one of the data constituting the second data sequence.

Similar to the first and second data sequences, the third and fourth data sequences are treated as a second group. At the head of the second group is arranged additional data including L i.e., the number of data constituting the third data sequence and (K−1) where K is the number of times the same data is repeated in the fourth data sequence. Following the additional data are arranged data constituting the third data sequence and one of the data constituting the fourth data sequence.

Then, all following data is stored in memory the same way as mentioned above.

Figure 6:
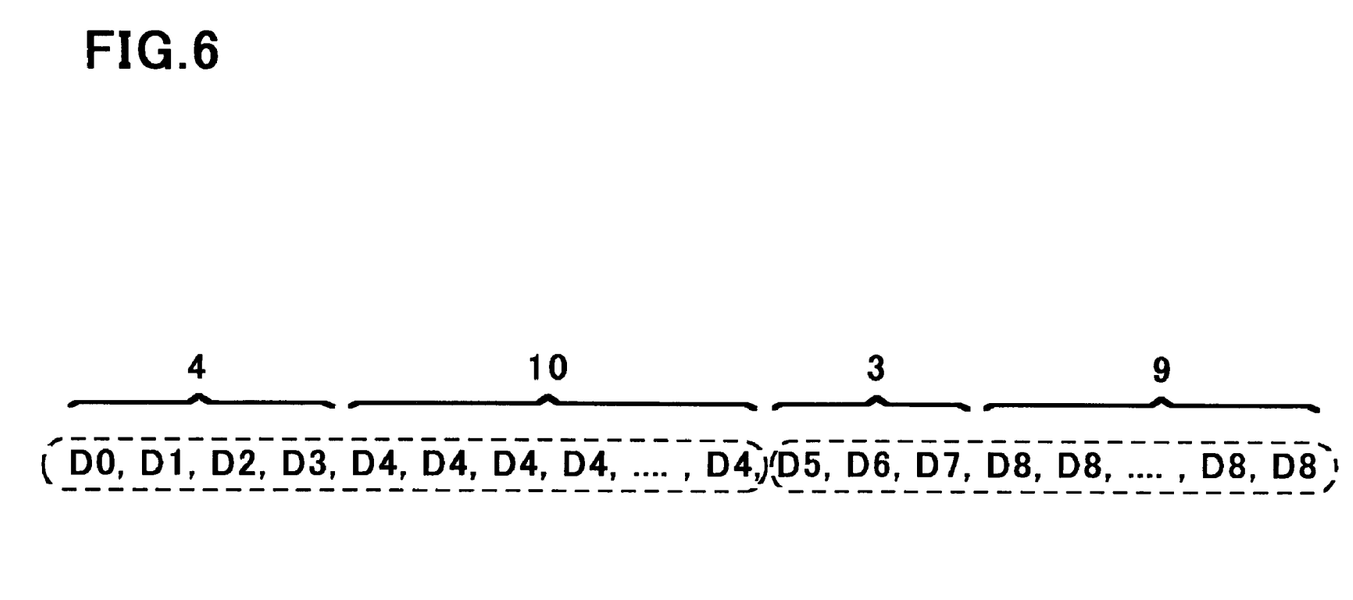
FIG. 6 shows a detailed example of data to be input into memory in a circuit for recording digital waveform data in accordance with the present invention.
Figure 7:
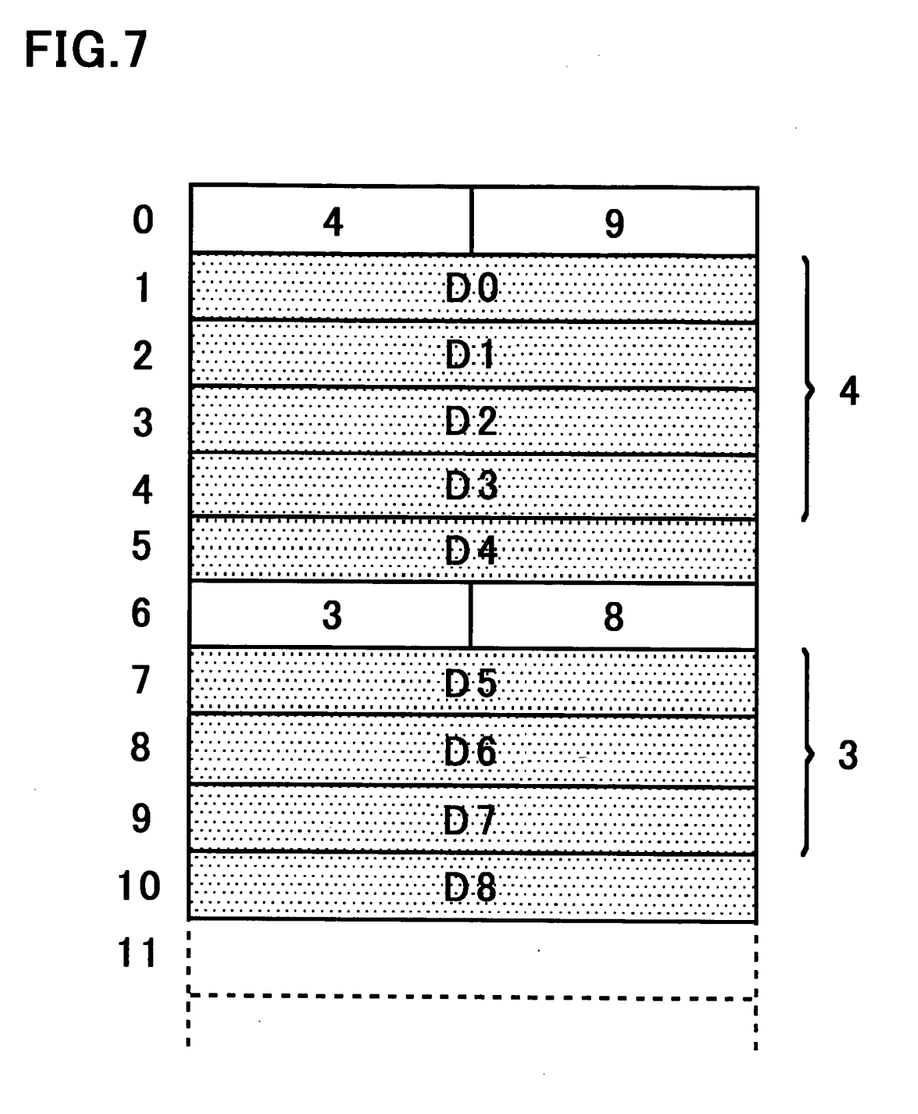
FIG. 7 shows data stored in a memory in a circuit for recording digital waveform data in accordance with the present invention.

FIGS. 6 and 7 show a detailed example of arrangement of data sequences.

With reference to FIG. 6, it is assumed that data including the following data sequences is input into a memory:
 (a) a first data sequence including 4 data D0 to D3 wherein data D0 to D3 are different from one another;
 (b) a second data sequence including 10 data D4;
 (c) a third data sequence including 3 data D5 to D7 wherein data D5 to D7 are different from one another; and
 (d) a fourth data sequence including 9 data D8.

FIG. 7 shows arrangement of the above-mentioned first to fourth data sequences in a memory.

As illustrated in FIG. 7, the first and second data sequences are treated as a first group. At the head of the first group is arranged additional data including 4 i.e., the number of data constituting the first data sequence, and 9, which is calculated from the equation (10-1). Following the additional data are arranged data D0 to D3 constituting the first data sequence and data D4 constituting the second data sequence.

Similar to the first and second data sequences, the third and fourth data sequences are treated as a second group. At the head of the second group is arranged additional data including 3 i.e., the number of data constituting the third data sequence, and 8, which is calculated from the equation (9-1). Following the additional data are arranged data D5 to D7 constituting the third data sequence and data D8 constituting the fourth data sequence.

In accordance with the above-mentioned present invention, when the same data is repeatedly input into memory, the number in which the same data is repeated is stored into the memory. Hence, it would be possible to reduce memory capacity for storing digital waveform data.

There is further provided a circuit for recording digital waveform data, including (a) a first counter that counts the number of data constituting a first data sequence including a plurality of data different from one another, (b) a second counter that counts the number of times the same data is repeated to constitute a second data sequence, (c) a memory that stores all of the data constituting the first data sequence and one of the data constituting the second data sequence in order together with the number counted by the first counter and the number counted by the second counter, and (d) a controller that transmits an address signal to the memory, and controls the first and second counters.

The circuit may further include (e) a data latch register for storing input data, (f) a selector that selects data to be stored in memory, the selector being controlled by the controller, and (g) a comparator that compares the first data stored in the data latch register to the second data newly input into the data latch register.

In another aspect of the present invention, there is provided a method for recording digital waveform data, including the steps of (a) assuming that a first data sequence includes a plurality of data different from one another and a second data sequence includes a plurality of the same data, counting the number of data constituting the first data sequence, (b) counting the number of times the same data is repeated in the second data sequence, and (c) recording data including all of data constituting the first data sequence and one of the data constituting the second data sequence in order, together with additional data including the number counted in the step (a) and the number counted in the step (b).

The method may further include the step (d) of writing the additional data into a common address. For instance, the additional data may be written in step (d) into an address located immediately before the first data sequence or into an address located immediately subsequent to the second data sequence.

There is further provided a method of recording digital waveform data, including the steps of (a) storing data into a data latch register, and resetting first and second counters to 0 and 1, respectively, wherein the first counter counts the number of data constituting a first data sequence including a plurality of data different from one another, and the second counter that counts the number of times the same data is repeated to constitute a second data sequence, (b) comparing first data stored in the data latch register to second data newly input into the data latch register, (c) storing second data into the data latch register and adding 1 to the first counter, if the first and second data are not equal to each other, or storing additional data including the numbers counted by the first and second counters and adding 1 to the second counter, if the first and second data are equal to each other, (d) comparing newly input data to data stored in the data latch register, and (e) storing the additional data and adding 1 to the second counter, if the data are equal to each other in the step (d), or storing all of data constituting the first data sequence, one of data constituting the second data sequence, and the additional data, if the data are not equal to each other in the step (d).

The advantages obtained by the aforementioned present invention will be described hereinbelow.

In accordance with the present invention, when the same data is repeatedly input, the number of times the same data is repeated is stored into a memory. Hence, the first advantage is that it would be possible to reduce memory capacity for storing digital waveform data including repeated same data.

The second advantage is that since the circuit in accordance with the present invention is quite simple in structure, the circuit would occupy just a small area. In addition, since one data input requires one instance of data-writing in a memory, it would be possible to use a memory having an access cycle almost equal to a cycle in which data is input, thereby facilitating efficient circuit design.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

FIRST EMBODIMENT

Figure 8:
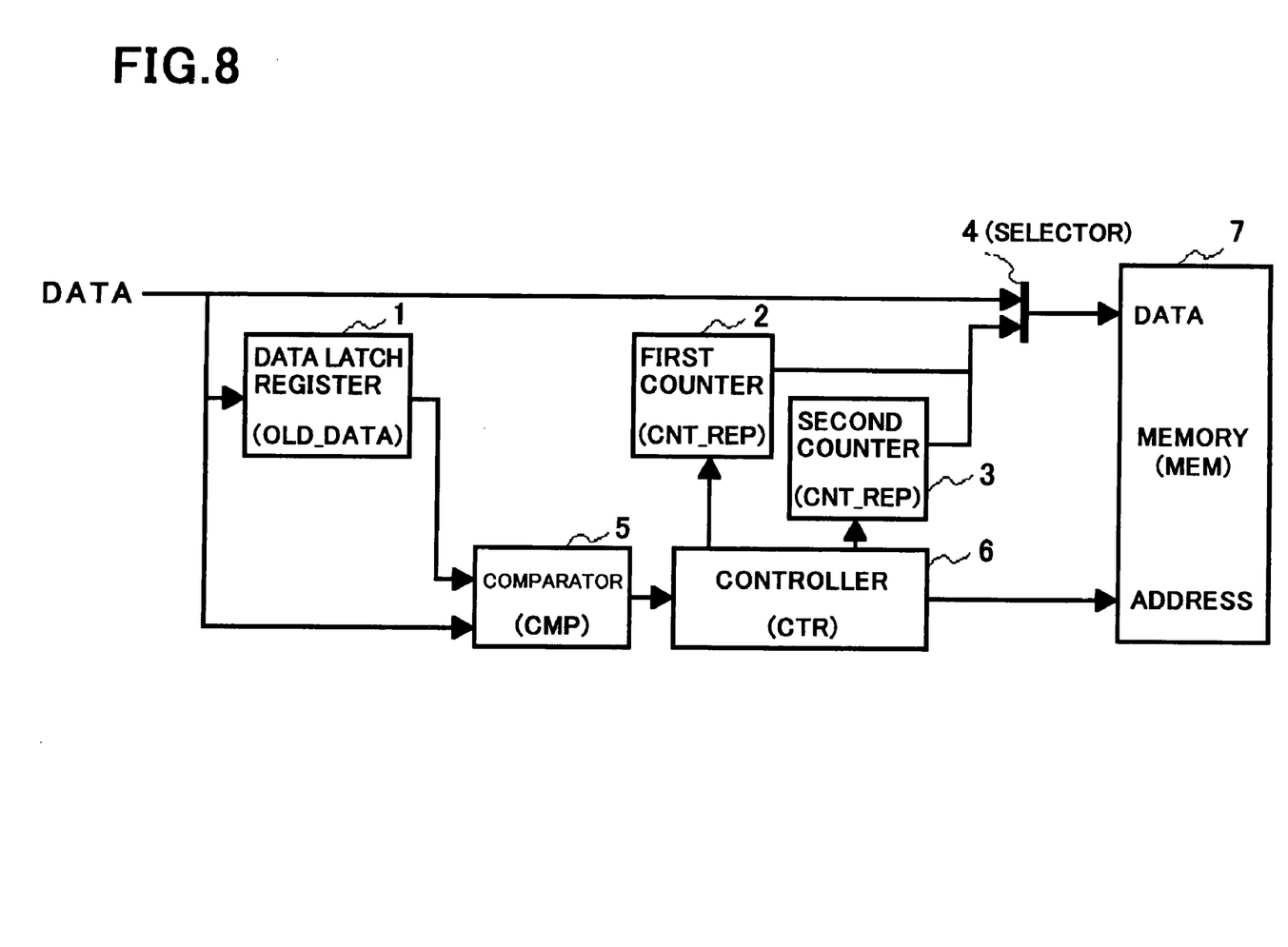
FIG. 8 is a block diagram of a circuit for recording digital waveform data in accordance with the first embodiment.
Figure 9:
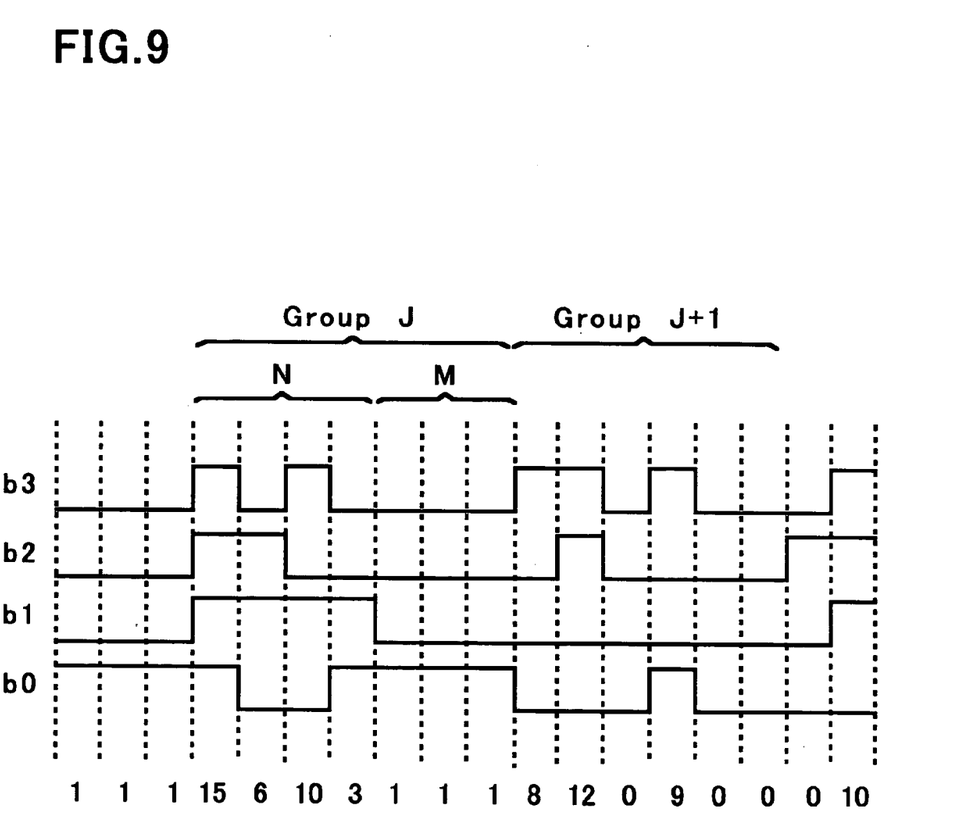
FIG. 9 shows an example of data to be input into a circuit for recording digital waveform data in accordance with the first embodiment.
Figure 10:
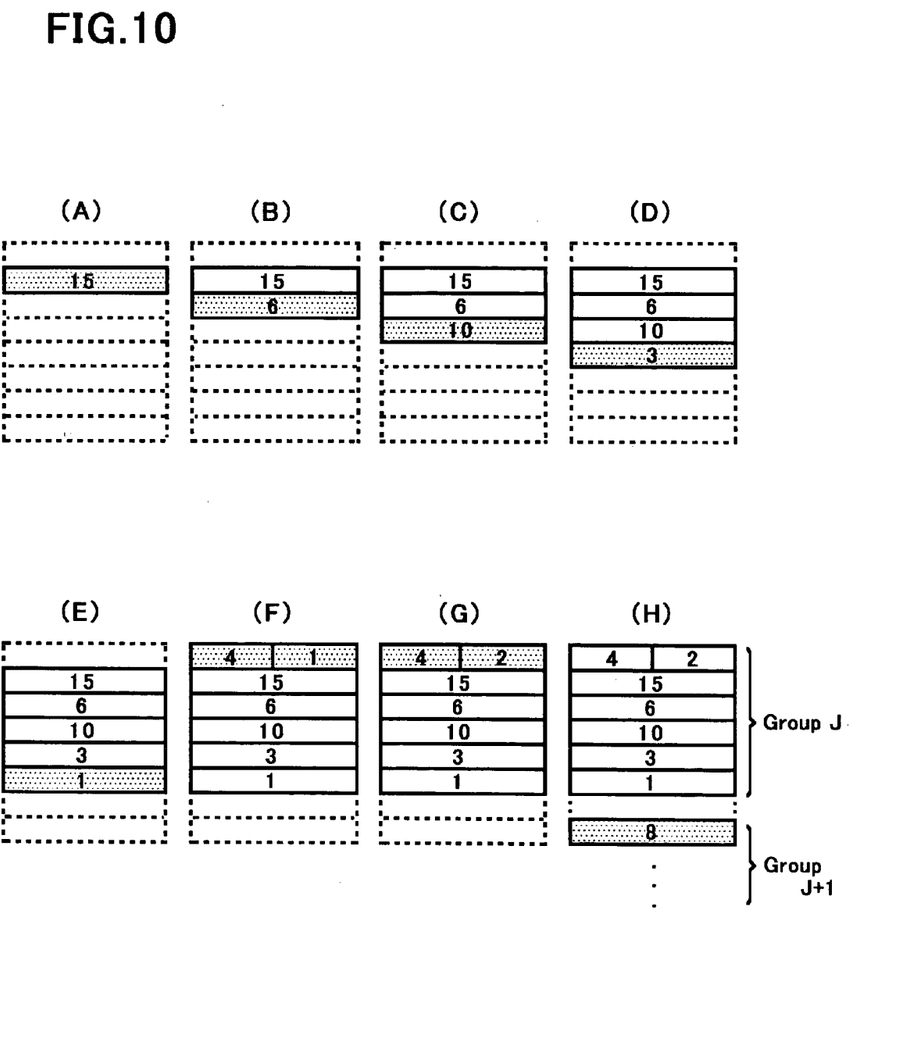
FIG. 10 shows data stored in a memory in a circuit for recording digital waveform data in accordance with the first embodiment.
Figure 11:
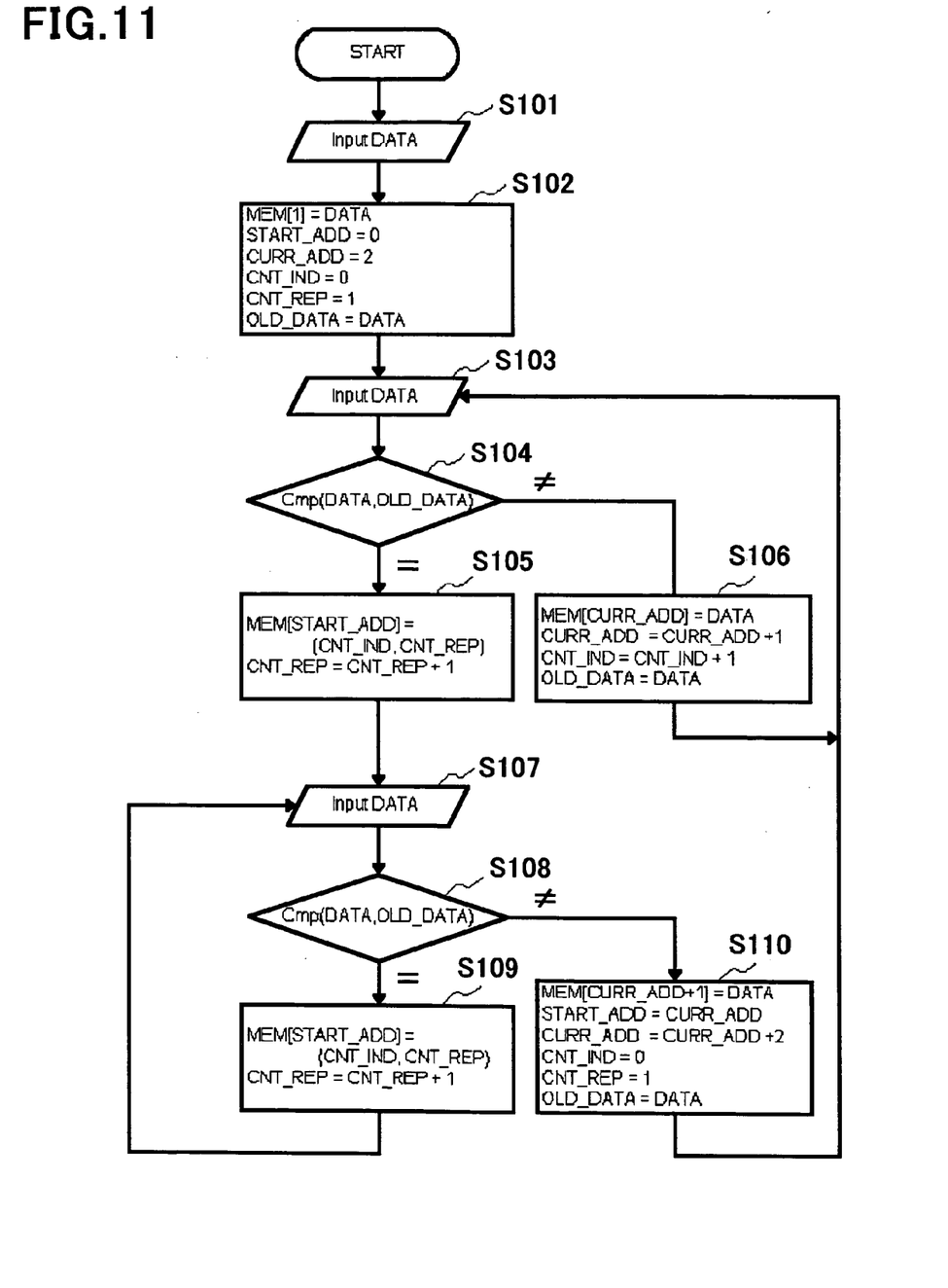
FIG. 11 is a flow chart illustrating the steps of a method for recording digital waveform data into a circuit for recording digital waveform data in accordance with the first embodiment.

Hereinbelow a circuit for recording digital waveform data in accordance with the first embodiment is explained with reference to FIGS. 8 to 11. FIG. 8 is a block diagram of a circuit in accordance with the first embodiment. FIG. 9 illustrates an example of waveform data to be input into the circuit of FIG. 8. FIG. 10 shows a sequence for storing waveform data into a memory. And, FIG. 11 is a flow chart of a process for storing digital waveform data into a memory.

In accordance with the first embodiment, with reference to FIG. 8, the circuit for recording digital waveform data is comprised of a data latch register (OLD_DATA) 1 that latches data input thereinto, a first counter (CNT_IND) 2 that counts the number of data constituting a first data sequence, the first data sequence being comprised of data that are different from one another, a second counter (CNT_REP) 3 that counts the number of repetitions of the same data in a second data sequence, a selector (SEL) 4 that selects input data or the number counted by the first counter (CNT_IND) 2 or the second counter (CNT_REP) 3 as data to be stored into a memory 7, a comparator (CMP) 5 that compares data immediately previously stored in the data latch register 1 to data presently stored in the data latch register (OLD_DATA) 1, a controller (CTR) 6 that transmits an address signal to a memory (MEM) 7 and controls operation of the first counter (CNT_IND) 2, the second counter (CNT_REP) 3, the selector (SEL) 4 and the memory 7.

In operation, data (DATA) input into the circuit is compared to the previous data in the comparator (CMP) 5 to determine whether they are identical with each other. Depending upon the comparison result, the controller (CTR) 6 operates the first counter (CNT_IND) 2 or the second counter (CNT_REP) 3. Specifically, if the comparator (CMP) 5 judges that newly input data (DATA) is different from the data presently stored in the data latch register (OLD_DATA) 1, the comparator (CMP) 5 transmits a signal indicative of that judgment to the controller (CTR) 6. On receipt of the signal, the controller (CTR) 6 operates the first counter (CNT_IND) 2. If the comparator (CMP) 5 judges that newly input data (DATA) is identical to data presently stored in the data latch register (OLD_DATA) 1, the comparator (CMP) 5 transmits a signal indicative of that judgment to the controller (CTR) 6. On receipt of the signal, the controller (CTR) 6 operates the second counter (CNT_REP) 3.

The controller (CTR) 6 further transmits a control signal to the selector (SEL) 4 and an address signal to the memory (MEM) 7 in order to write input data, the number counted by the first counter (CNT_IND) 2 or the second counter (CNT_REP) 3 into the memory (MEM) 7.

Then, input data is stored in the data latch register (OLD_DATA) 1. The thus stored data is compared to newly input data, as mentioned above.

Hereinbelow the operation of the circuit illustrated in FIG. 8, when waveform data illustrated in FIG. 9 is input into the circuit is explained. The waveform data illustrated in FIG. 9 includes Group J comprised of a data sequence of (15, 6, 10, 3, 1, 1, 1), and Group J+1 comprised of a data sequence of (8, 12, 0, 9, 0, 0).

FIG. 10 shows steps of storing Group J data into the memory 7.

First, the first data item, "15", in Group J is stored in a second address in memory associated with Group J, as illustrated in FIG. 10(A). At the same time, the first counter (CNT_IND) 2 is reset to zero (0), and the second counter (CNT_REP) 3 is set to one (1).

Then, the second data item, "6", in Group J is stored in a third address in memory, as illustrated in FIG. 10(B). At the same time, the first counter (CNT_IND) 2 becomes one (1).

Then, the third data item, "10", in Group J is stored in a fourth address in memory, as illustrated in FIG. 10(C). At the same time, the first counter (CNT_IND) 2 becomes two (2).

Then, the fourth data item, "3", in Group J is stored into a fifth address in the memory, as illustrated in FIG. 10(D). At the same time, the first counter (CNT_IND) 2 becomes three (3).

Then, the fifth data item, "1", in Group J is stored into a sixth address in the memory, as illustrated in FIG. 10(E). At the same time, the first counter (CNT_IND) 2 becomes four (4).

Since the sixth data item "1" is identical to the fifth data item, the number "4" stored in the first counter (CNT_ID) 2 and the number "1" stored in the second counter (CNT_REP) 3 are both stored in a first address in memory, as illustrated in FIG. 10(F). At the same time, the second counter (CNT_REP) 3 becomes two (2).

Since the seventh data item "1" is identical to the sixth data item, the number "4" presently stored in the first counter (CNT_ND) 2 and the number "2" presently stored in the second counter (CNT_REP) 3 are both stored into the first address in the memory, as illustrated in FIG. 10(G). At the same time, the second counter (CNT_REP) 3 is made incremental up to three (3).

Since the eighth data item, "8", is not identical to the seventh data item, the method for processing data in Group J is finished.

Then, a method for processing data in Group J+1 starts. A memory assigned to Group J+1 has addresses starting from an address next to the final address in the memory assigned to Group J. The eighth data, "8", is stored in a second address in memory assigned to Group J+1, as illustrated in FIG. 10(H).

FIG. 11 is a flow chart illustrating the operation steps of the circuit for recording digital waveform data, in accordance with the first embodiment. Hereinbelow is explained the operation of the circuit with reference to FIG. 11.

First a data item is input into the circuit in step S101.

Then, the input data is written into a first address in memory (MEM[1]). And, a register (START_ADD) storing the memory addresses where data obtained by the first and second counters 2 and 3 is set to zero (0). A register (CURR_ADD) that stores the address for setting data in the controller 6 is set to two (2). The first counter (CNT_IND) 2 is set to zero (0). The second counter (CNT_REP) 3 is set to one (1). And, input data DATA is stored into the data latch register (OLD_DATA) 1, in step S102.

Then, the next data item is input in step S103.

Then, the comparator (CMP) 5 compares the current data item with the previous data item (OLD_DATA) stored in the data latch register 1, in step S104.

If the data items are identical with each other, the number stored by the first counter (CNT_IND) 2 and the number stored by the second counter (CNT_REP) 3 are both written in an address stored in the register (START_ADD). Then, the number stored in the second counter (CNT_REP) 3 advances in step S105.

If the data items are not identical with each other, input data (DATA) is written into an address stored in the register (CURR_ADD), the number stored in the register (CURR_ADD) advances, the number stored in the first counter (CNT_IND) 2 advances, and the input data (DATA) is stored in he data latch register 1, in step S106. These steps S106, S103 and S104 are repeatedly carried out until the newly input data and the previous data stored in the data latch register 1 become identical with each other.

However, when the previous two data inputs are identical, then another data item is input into the circuit in step S107, and the comparator (CMP) 5 compares this data item with the previous data item (OLD_DATA) stored in the data latch register 1, in step S108.

If the data items are identical to each other, the number stored by the first counter (CNT_IND) 2 and the number stored by the second counter (CNT_REP) 3 are both written in an address indicated by the register (START_ADD), and the number stored in the second counter (CNT_REP) 3 advances in step S109.

If the data items are not identical to each other, the input data item (DATA) is written into an address next to an address stored in the register (CURR_ADD), data stored in the register (CURR_ADD) is copied into the register (START_ADD), and two (2) is added to the number stored in the register (CURR_ADD), in step S110. Further, the number stored in the first counter (CNT_IND) 2 is set to zero (0), the number stored in the second counter (CNT_REP) 3 is set to one (1), and the input data (DATA) is stored into the data latch register 1, in step S110.

If they are identical with each other, the above-mentioned steps S109, S107 and S108 are repeatedly carried out if a new data item is identical to a previous data item. If the data items are not identical with each other, the above-mentioned steps S110 and S103 to S108 are repeatedly carried out.

In accordance with the above-mentioned method, when the same data items, e.g., digital waveform data generated from LSI, is repeatedly input, then the number of times the same data is repeated is stored in memory. Hence, it is possible to reduce memory capacity for storing digital waveform data that includes repeated data.

Since it never happens that both of the numbers stored in the first counter (CNT_IND) 2 and the second counter (CNT_REP) 3 are zero, if data input is interrupted before all data is input into the circuit, it would be possible to indicate that data input was interrupted by writing zero into the first counter (CNT_IND) 2 and the second counter (CNT_REP) 3. In addition, since the amount of data in each of the Groups is equal to two (2) plus the number stored in the first counter (CNT_IND) 2 associated with the Group, it would be possible to return back to the initial data by tracing from an address zero.

SECOND EMBODIMENT

Figure 12:
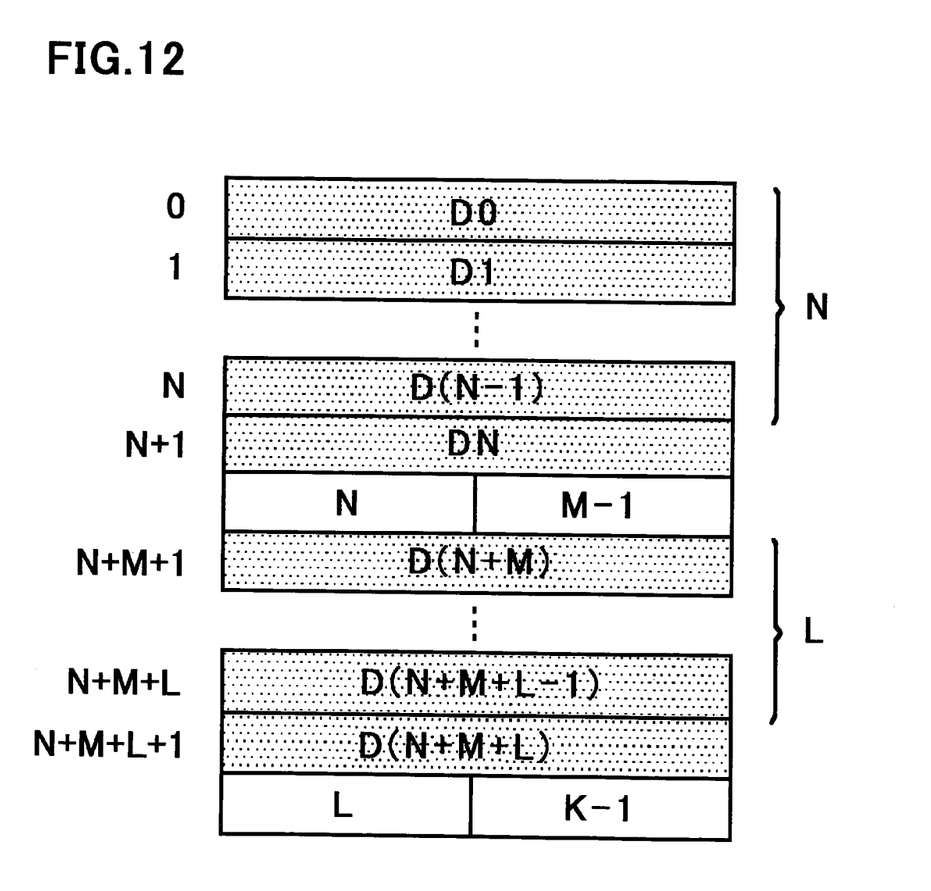
FIG. 12 illustrates what is stored in a memory in a circuit for recording digital waveform data in accordance with the second embodiment.
Figure 13:
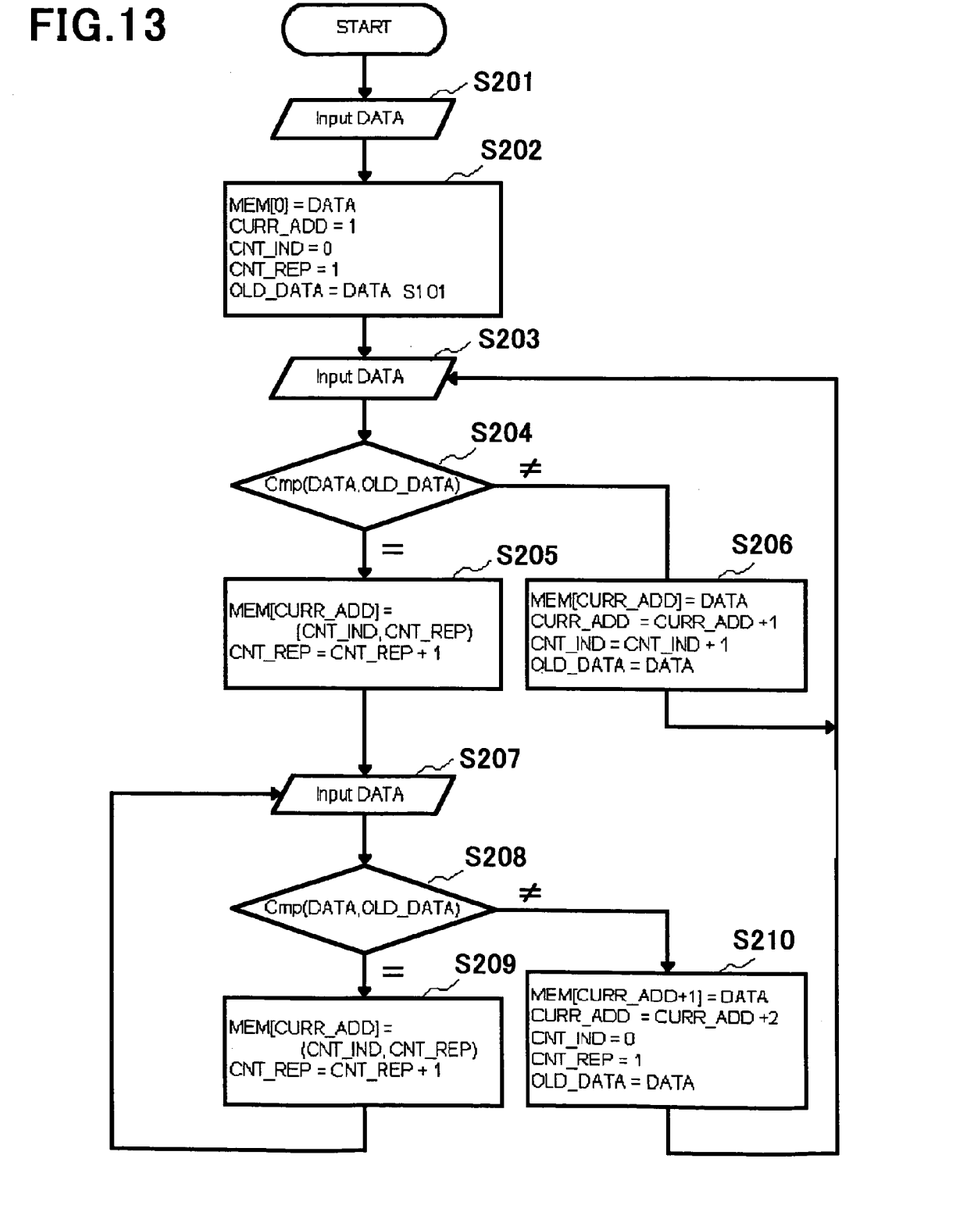
FIG. 13 is a flow chart illustrating the steps of a method of recording digital waveform data in a circuit for recording digital waveform data in accordance with the second embodiment.

Hereinbelow is explained a circuit for recording digital waveform data, in accordance with the second embodiment with reference to FIGS. 12 and 13. FIG. 12 illustrates what is stored in memory in a circuit in accordance with the second embodiment, and FIG. 13 is a flow chart of a method of storing digital waveform data in memory in the aforementioned circuit.

The circuit in accordance with the second embodiment has the same structure as the structure of the circuit in accordance with the first embodiment. The second embodiment is different from the first embodiment in that the additional data, including the number stored in the first counter (CNT_IND) 2 and the number stored in the second counter (CNT_REP) 3 is stored in a final address in memory 5 assigned to Group instead of the first. An example of such data arrangement is shown in FIG. 12.

In FIG. 12, the data illustrated in FIG. 4 is input into the circuit. As illustrated in FIG. 12, the first and second data sequences are treated as a first group. First, data constituting the first data sequence and one of data constituting the second data sequence are stored in addresses. Subsequently to the first group is arranged additional data including N which means the number of data constituting the first data sequence and (M−1) in which M means the number by which the same data is repeated in the second data sequence.

Similarly to the first and second data sequences, the third and fourth data sequences are treated as a second group. First, data constituting the third data sequence and one data item constituting the fourth data sequence are stored in addresses. Subsequently to the second group, additional data items are arranged including L, which is the number of data constituting the third data sequence and (K−1), where K is the number of times the same data is repeated in the fourth data sequence.

FIG. 13 is a flow chart illustrating steps to be carried out in an operation of the circuit for recording digital waveform data, in accordance with the second embodiment. Hereinbelow is explained an operation of the circuit with reference to FIG. 13.

First, a data item is input into the circuit in step S201.

Then, the input data item is written into an address 0 in a memory (MEM[0]), a register (CURR_ADD) storing an address for setting data in the controller 6 is set to one (1), the first counter (CNT_IND) 2 is set to zero (0), the second counter (CNT_REP) 3 is set to one (1), and the input data DATA is stored into the data latch register (OLD_DATA) 1, in step S202.

Then, the next data item is input in step S203.

Then, the comparator (CMP) 5 compares the thus input next data with the previous data (OLD_DATA) stored in the data latch register 1, in step S204.

If the data items are identical to each other in step S204, the number stored by the first counter (CNT_IND) 2 and the number stored by the second counter (CNT_REP) 3 are both written into an address stored in the register (CURR_ADD). And, the number stored in the second counter (CNT_REP) 3 is advanced, in step S205.

If the data items are not identical to each other in step S204, input data (DATA) is written into an address stored in the register (CURR_ADD). The number stored in the register (CURR_ADD) is advanced. The number stored in the first counter (CNT_IND) 2 is advanced. And, the input data (DATA) is stored into the data latch register 1, in step S206. These steps S206, S203 and S204 are repeatedly carried out until the newly input data and the previous data stored in the data latch register 1 become identical to each other.

However, when the previous two data inputs are identical, then when another data item is input into the circuit in step S207, the comparator (CMP) 5 compares the next data item with the previous data item (OLD DATA) stored in the data latch register 1, in step S208. If the data items are identical to each other in step S208, the number stored by the first counter (CNT_IND) 2 and the number stored by the second counter (CNT_REP) 3 are both written into an address indicated by the register (CURR_ADD), and the number stored in the second counter (CNT_REP) 3 advances in step S209. Whenever at least two identical data items differ from the next data item in the sequence, steps S209, S207 and S208 are repeatedly carried out until the previous data item and current data item differ.

When the data items are not identical to each other in step S208, input data (DATA) is written into an address next to an address stored in the register (CURR_ADD), and two (2) is added to the number stored in the register (CURR_ADD), in step S210. Further, the number stored in the first counter (CNT_IND) 2 is set to zero (0), the number stored in the second counter (CNT_REP) 3 is set to one (1), and the input data (DATA) is stored into the data latch register 1, in step S210. The above-mentioned steps S210 and S203 to S208 are repeatedly carried out until two data items are identical.

In the second embodiment, in order to reproduce original data based on data stored in the memory, it would be necessary to trace data from data stored in the address where the number indicated in the first counter 2 is finally stored to previous data items. Hence, it is necessary to store an address where the number generated by first counter 2 is finally stored.

In the above-mentioned first and second embodiments, the number stored in the first counter (CNT_IND) 2 is stored in an upper area and the number stored in the second counter (CNT_REP) 3 is stored in a lower area in an address. It should be noted that the number stored in the second counter (CNT_REP) 3 may be stored in an upper area and the number stored in the first counter (CNT_IND) 2 may be stored in a lower area in an address.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-233258 filed on Aug. 1, 2001 including specification, claims, drawings and summary is incorporated herein by reference in its entirety.

What is claimed is:

1. A circuit for recording digital waveform data comprising:
    a data latch register for latching a first data sequence that includes a plurality of data different from one another and a second data sequence that includes a plurality of the same data, wherein data including all of data constituting said first data sequence and one of data constituting said second data sequence in this order is recorded in said circuit together with additional data including the number of data constituting said first data sequence and the number of times said same data is repeated in said second data sequence, and wherein said additional data is written into a common address.

2. A circuit for recording digital waveform data, comprising:
    a first counter which counts the number of data constituting a first data sequence including a plurality of data different from one another;
    a second counter which counts the number by which the same data is repeated to constitute a second data sequence;
    a memory which stores all of data constituting said first data sequence and one of data constituting said second data sequence in this order together with the number counted by said first counter and the number counted by said second counter; and a controller which transmits an address signal to said memory, and controls operation of said first and second counters, wherein said additional data is written into a common address.

3. The circuit as set forth in claim 2, further comprising:

a data latch register storing data input thereinto;

a selector which selects data to be stored in said memory and which is controlled in operation by said controller; and a comparator which compares first data stored in said data latch register to second data newly input into said data latch register.

4. A method of recording digital waveform data, comprising the steps of:

(a) counting the number of data constituting a first data sequence wherein a first data sequence includes a plurality of data different from one another and a second data sequence includes a plurality of the same data;

(b) counting the number by which said same data is repeated in a second data sequence;

(c) recording data including all of the data constituting said first data sequence and one of the data constituting said second data sequence in this order, together with additional data including the number counted in said step (a) and the number counted in said step (b); and (d) writing said additional data into a common address.

5. A method of recording digital waveform data, comprising the steps of:

(a) storing data into a data latch register, and resetting first and second counters to 0 and 1, respectively, wherein said first counter counts the number of data constituting a first data sequence including a plurality of data different from one another, and said second counter which counts the number by which the same data is repeated to constitute a second data sequence;

(b) comparing first data stored in said data latch register to second data newly input into said data latch register;

(c) storing second data into said data latch register and adding 1 to said first counter, if said first and second data are not equal to each other, or storing additional data including the numbers counted by said first and second counters and adding 1 to said second counter, if said first and second data are equal to each other;

(d) comparing newly input data to data stored in said data latch register; and (e) storing said additional data and adding 1 to said second counter, if data are equal to each other in said step (d), or storing all of data constituting said first data sequence, one of data constituting said second data sequence, and said additional data, if said data are not equal to each other in said step (d).

6. The method as set forth in claim 5, further comprising a step (f) of writing said additional data into a common address.

7. The method as set forth in claim 6, wherein said additional data is written in said step (f) into an address located immediately before said first data sequence.

8. The method as set forth in claim 6, wherein said additional data is written in said step (f) into an address located immediately subsequent to said second data sequence.

9. A circuit for recording digital waveform data, comprising a data latch register for latching a first data sequence that includes a plurality of data different from one another and a second data sequence that includes a plurality of the same data, where data including all of data constituting said first data sequence and one of data constituting said second data sequence in this order is recorded in said circuit together with additional data including the number of data constituting said first data sequence and the number of times said same data is repeated in said second data sequence, wherein said additional data is written into an address located immediately before said first data sequence or immediately subsequent to said second data sequence.

10. A circuit for recording digital waveform data, comprising:

a first counter which counts the number of data constituting a first data sequence including a plurality of data different from one another;

a second counter which counts the number by which the same data is repeated to constitute a second data sequence;

a memory which stores all of data constituting said first data sequence and one of data constituting said second data sequence in this order together with the number counted by said first counter and the number counted by said second counter; and a controller which transmits an address signal to said memory, and controls operation of said first and second counters, wherein said additional data is written into an address located immediately before said first data sequence or immediately subsequent to said second data sequence.

11. A method of recording digital waveform data, comprising the steps of:

(a) counting the number of data constituting a first data sequence wherein a first data sequence includes a plurality of data different from one another and a second data sequence includes a plurality of the same data;

(b) counting the number by which said same data is repeated in a second data sequence; and (c) recording data including all of the data constituting said first data sequence and one of the data constituting said second data sequence in this order, together with additional data including the number counted in said step (a) and the number counted in said step (b);

(d) writing said additional data into an address located immediately before said first data sequence or immediately subsequent to said second data sequence.

12. The circuit as set forth in claim 10, further comprising:

a data latch register storing data input thereinto;

a selector which selects data to be stored in said memory and which is controlled in operation by said controller; and a comparator which compares first data stored in said data latch register to second data newly input into said data latch register.

* * * * *